United States Patent

Shieh et al.

[11] Patent Number: 6,118,702
[45] Date of Patent: Sep. 12, 2000

[54] SOURCE BIAS COMPENSATION FOR PAGE MODE READ OPERATION IN A FLASH MEMORY DEVICE

[75] Inventors: Ming-Huei Shieh; Bhimachar Venkatesh, both of Cupertino, Calif.

[73] Assignee: Advanced Micro Devices, Inc., Sunnyvale, Calif.

[21] Appl. No.: 09/421,151

[22] Filed: Oct. 19, 1999

[51] Int. Cl.[7] .................................................. G11C 16/06
[52] U.S. Cl. .................................. 365/185.21; 365/185.2; 365/185.22; 365/185.11; 365/185.12; 365/210; 365/238.5
[58] Field of Search .......................... 365/185.21, 185.22, 365/185.2, 185.11, 185.12, 210, 238.5

[56] References Cited

U.S. PATENT DOCUMENTS 5,923,590  8/1999  Yero ..................................... 365/189.01
5,943,286  8/1999  Orita ..................................... 365/230.03

Primary Examiner—David Nelms
Assistant Examiner—Connie C. Yoha
Attorney, Agent, or Firm—Brinks Hofer Gilson & Lione

[57] ABSTRACT

A page mode memory senses a large number of bits simultaneously. The associated read current creates a source bias in the core cells which alters the sense margin at the sense amplifier. To address this problem, a memory integrated circuit (100) includes an array (102) of core cells, each core cell having a ground node (220, 222, 224). A ground line (230) couples the ground node of each core cell to a ground potential (Vss) and establishes a variable parasitic potential between the ground node and Vss. For sensing the data state of the core cells, a reference core cell (252) matches the array core cells and has a reference ground node (262). A circuit element (256) is coupled between the reference ground node and Vss to establish a variable reference potential to match the variable parasitic potential.

16 Claims, 1 Drawing Sheet

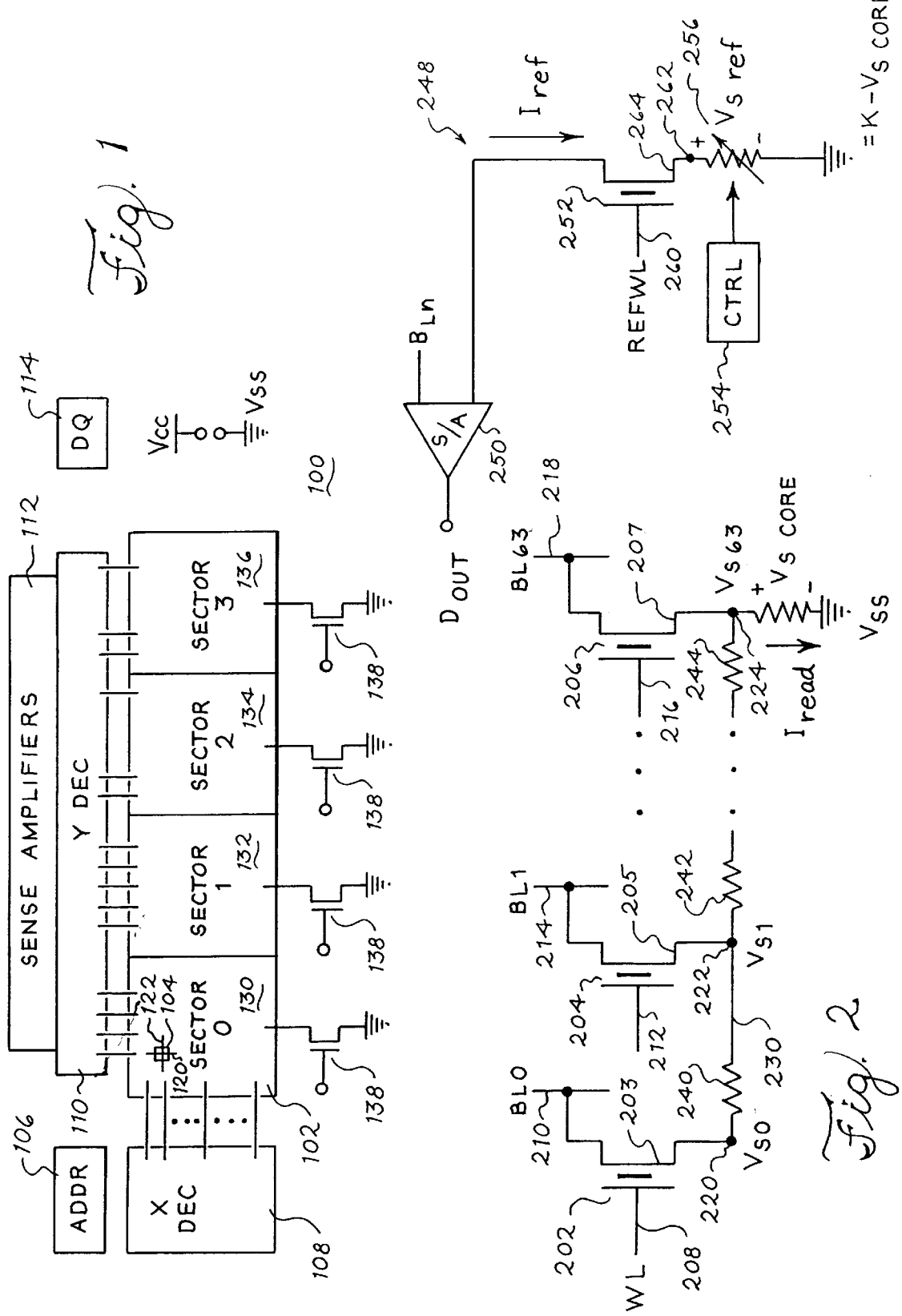

SOURCE BIAS COMPENSATION FOR PAGE MODE READ OPERATION IN A FLASH MEMORY DEVICE

BACKGROUND OF THE INVENTION

The present invention relates generally to memory integrated circuits. More particularly, the present invention relates to accurate sensing of data in page mode memory integrated circuits which sense a large number of bits simultaneously.

A memory integrated circuit includes a plurality of core cells arranged in an array. Each core cell is uniquely addressable for writing and reading data. In a non-volatile memory such as a flash or electrically eraseable programmable read only memory (EEPROM), each core cell includes a control gate coupled to a word line for read/write access to a bit line and a transistor having a floating gate for storing charge. The core cell is written and read by applying appropriate voltages to the bit line and the word line.

In a page mode memory, a plurality of multiple bit words of data are sensed in the memory substantially simultaneously. Subsequently, individual words of the plurality of words are presented at the output of the memory. In one example, a page of four words is initially read. Each word is sixteen bits wide and is subsequently available for reading.

The advantage of page mode operation is reduction of the access time necessary to read words on the page after the initial page access. The initial read operation requires the full random access read time, which is for example 80 ns. Subsequent reads from the same page require only a page access read time, which may be only 25 ns.

In page mode, at the time of the initial read operation, four 16 bit words, or a total of 64 bits, are sensed. Sensing is detecting the stored data state in the memory. This is done by detecting the current sunk by the selected core cell and comparing this read current with a reference current in a reference core cell.

In a nonvolatile memory such as a flash memory, a core cell is programmed by selectively storing charge on a floating gate. If charge is stored on the floating gate, the threshold voltage of the core cell transistor is high so that the transistor of the core cell is turned off when a word line voltage is applied to the control gate of the transistor. In the off state, the current sunk by the memory cell is only a few nanoamps. If no charge is stored on the floating gate, the threshold voltage of the core cell transistor is low enough so that the transistor is turned on when a word line voltage is applied on the control gate of the core cell. When the transistor of the core cell is turned on, the core cell will sink approximately 10 to 20 $\mu$A. In page mode, this current can vary from essentially 0 amps to 64×20 $\mu$A=1.28 mA.

The read current flows in the core cells from bit lines connecting each column of the core cell array to ground. Ground potential is typically provided in the core cell array on a diffused semiconductor layer doped n+ to minimize its sheet resistance. Also, these ground paths may be intermittently strapped to Vss using a high conductivity layer such as metal. However, the read current in the diffused ground paths causes the ground node in the core cell array to vary from true ground. This establishes a source bias, in which the source of the core cell transistor is a few hundred microvolts or a few millivolts above ground potential, or Vss. In the same transistor, the bulk or body potential is quite close to Vss. This can cause a body effect in the core cell transistor in which the threshold voltage varies and the read current is reduced. Read current in a core cell may be only 6 or 7 $\mu$A.

Moreover, the read current in the array and therefore the source bias in the individual core cells varies as a function of the stored data states of the core cells. If charge is not stored in the floating gates of many or most core cells, the read current will be higher than otherwise. Still further, the read current in the array and the source bias in the core cells varies with the selected location in the array and with the data stored in the vicinity of the selected location.

The effect of this current in the ground bus of the core cell array current and source bias in the core cells is to change the sense margin of the circuit which senses the read current in the selected core cell. As noted, the sensing circuit operates by comparing the selected cell's read current, which may be approximately 0 to 10 microamps, with a reference current having a value of, for example, 5 $\mu$A. If, due to current in the ground bus, the read current in the core cells varies only between approximately 0 $\mu$A and 6 or 7 $\mu$A, the reference current is no longer centered in the read current range. This will skew the read access times. Moreover, because of the great variability of the read current, the read access times for the core cells will vary randomly and unpredictably across the core cell array. The operation of the memory will be slowed and accurate read data may not result.

The problem is enhanced with a new design involving page mode reading of 16 bit words. Previously, in a memory in which only a single 16 bit word was read, the total ground current was only 16×20 $\mu$A or 320 $\mu$A. In a page mode device, as noted, four or more words are simultaneously sensed so that the current in the ground bus may be at least four times as great. As noted, though, this current is completely unpredictable in its location and magnitude.

Accordingly there is a need for an improved memory and method for sensing data in a page mode memory which can rapidly and reliably sense the data states in the selected core cells without error or delay due to the current in the core cell array.

BRIEF SUMMARY OF THE INVENTION

By way of introduction only, a memory and method for reading a page mode memory in accordance with the present invention reduces the effect of source bias due to high read current in page mode by applying a proportional source bias to the read reference core cell. In this manner, the threshold against which the read current in the core cell is measured varies along with the read current variation due to source bias. The proportional source bias can take account of the variability of the source bias across the array by accommodating the pattern of data stored when determining the source bias to apply.

The foregoing discussion of the preferred embodiments has been provided only by way of introduction. Nothing in this section should be taken as a limitation of the following claims, which define the scope of the invention.

BRIEF DESCRIPTION OF SEVERAL VIEWS OF THE DRAWINGS

FIG. 1 is a block diagram of a memory integrated circuit; and

FIG. 2 is a circuit diagram of a portion of the memory integrated circuit of FIG. 1.

DETAILED DESCRIPTION OF THE PRESENTLY PREFERRED EMBODIMENTS

Referring now to the drawing, FIG. 1 is a block diagram of a memory integrated circuit 100. The memory integrated circuit 100 may be any suitable type of integrated circuit fabricated using conventional semiconductor processing techniques. In the illustrated embodiment, the memory integrated circuit 100 is a flash memory, which is a type of nonvolatile memory. However, the principles described herein can be readily extended to other types of memory as well.

The memory integrated circuit 100 includes a core cell array 102 of core cells, such as core cell 104, address input circuits 106, an X decoder 108, a Y decoder 110, a sensing circuit 112 and a data in/data out circuit 114. The integrated circuit 100 receives operating power at a node Vcc and ground potential at a node Vss.

The address input circuits 106 receive address signals from external to the memory integrated circuit 100. The address input circuits 106 in conjunction with the X decoder 108 uniquely decode one word line 122 of a plurality of word lines extending from the X decoder 108 to the core cell array 102. The decoded word line 122 is driven to a relatively high voltage, such as Vcc. All other word lines remain at a relatively low voltage, such as Vss.

The address input circuits 106 in conjunction with the Y decoder 110 decode one bit line 120 of a plurality of bit lines extending from the core cell array to the Y decoder 110. When the bit line 120 is decoded, it is coupled to the sensing circuit 112 for sensing the data state of the core cell 104 on the selected word line 122, referred to as the selected core cell 104. The bit line 120 may also be decoded for writing or programming the selected core cell 104.

The core cell array 102 comprises a plurality of core cells configured to store one or more bits of data. Each core cell such as core cell 104 is positioned at the intersection of a bit line 120 and a word line 122. Bit lines 120 run the length of the columns of the core cell array 102 and are used for sensing the data state of a selected core cell in the column. Word lines 122 run the width of the core cell array and are used for selecting a row of core cells.

In the illustrated flash memory embodiment, each core cell includes a transistor with a floating gate for storing charge. When charge is present on the floating gate, the transistor is turned off when selected and a negligible read current of only a few nanoamps flows in the bit line. When no charge is present on the floating gate, the transistor is turned on the read current is approximately 10 to 20 $\mu$A. The magnitude of the read current in the selected core cell is sensed by the sensing circuit 112. In the core cell, the source of the transistor is coupled to Vss so that read current sunk in the core cell is source current of the transistor to Vss.

The core cell array 102 may be divided into one or more banks or sectors. In FIG. 1, the memory integrated circuit 100 has a core cell array 102 divided into four sectors, including a first sector 130, a second sector 132, a third sector 134 and a fourth sector 136.

Dividing the core cell array 102 into sectors provides advantages in terms of speed of operation and reduced current drain. Each sector includes a sector pull down pass gate 138. The sector pull down pass gate 138 couples its associated sector to ground potential, Vss. Control signals selectively actuate the sector pull down pass gate 138. When address signals received at the memory integrated circuit 100 indicate that the selected core cell is not in a particular sector, signal decoding generates a control signal to turn isolate the sector from Vss so there is no current flow in the unselected sector. This reduces the current into Vss from un-selected sectors, thereby reducing overall current drain and power dissipation of the memory integrated circuit 100.

The data input/data output circuit 114 communicates data between the memory integrated circuit 100 and circuits external to the memory integrated circuit. Data sensed by the sensing circuits 112 are buffered and provided to the data input/data output circuit 114. When data is to be written to one or more core cells of the core cell array, the data are received at the data input/data output circuit 114. Separate programming circuitry generates the necessary decoding and programming voltages to store the data.

In some memory integrated circuits, additional core cells are added to provide redundancy. The redundant core cells may be switched in to take the place of core cells which are determined to be failing during testing of the integrated circuit.

The memory integrated circuit 100 is configured to operate in page mode. In page mode, a plurality of multiple bit words of data are sensed by the sensing circuit 112 substantially simultaneously. Subsequently, individual words of the plurality of words are presented at the data input/data output circuit 113 of the memory integrated circuit 100 in response to the address signals at the address input circuits 106. In the illustrated embodiment, a page of four words is initially read. Each word is sixteen bits wide and is subsequently available for reading. Thus, the address decoding circuitry including the X decoder 108 and the Y decoder 110 decodes a total of 64 bits. The sensing circuit 112 similarly senses 64 bits at a time.

During sensing in page mode, the total read current can vary from a very large current, if none of the decoded and sensed core cells stores charge and is not turned on, to a negligible value if all of the decoded and sensed core cells store charge and are turned on. If each core cell sinks 20 $\mu$A when it stores charge and is selected, the total read current is 64×20 $\mu$A=1.28 mA.

FIG. 2 is a circuit diagram illustrating a portion of the memory integrated circuit 100 of FIG. 1. In FIG. 2, three core cells including core cell 202, core cell 204 and core cell 206 are shown. Core cell 202 includes a transistor 203 having a gate coupled to a word line (WL) 208 and a drain coupled to a bit line 210, labeled BL0. Core cell 204 includes a transistor 205 having a gate coupled to a word line 212 and a drain coupled to a bit line 214, labeled BL1. Core cell 206 includes a transistor 207 having a gate coupled to a word line 216 and a drain coupled to a bit line 218, labeled BL63. The core cells 202, 204, 206 are representative of the sixty four core cells that are selected for sensing in page mode. The sixty four core cells including core cells 202, 204, 206 as such may share a common word line. However, if the core cells 202, 204, 206 are located in different sectors of the core cell array, the word lines selecting the core cells 202, 204, 206 will be separate word lines. The more general case is illustrated in FIG. 2.

Each core cell 202, 204, 206 also includes a ground node at the source of the transistor. Thus, core cell 202 has a ground node 220 at the source of transistor 203, core cell 204 has a ground node 222 at the source of transistor 205 and core cell 206 has a ground node 224 at the source of transistor 207. Each ground node 220, 222, 224 is electrically coupled to ground potential, or Vss.

FIG. 2 also shows a ground line 230 coupling the ground node of each core cell 202, 204, 206 to ground potential. The ground line 230 is made up of parasitic resistances in the Vss node of each core cell. In a typical embodiment, each core cell is arranged with the Vss or ground node formed of n+ doped silicon. This n+ region in each core cell is contiguous with similar regions in adjacent core cells to minimize the size of the core cell and increase the packing density of the core cell array. At some places, such as every 20 columns, the n+ semiconductor region may be strapped with metal coupled to Vss. However, the n+ regions act as parasitic resistors in each core cell and in aggregation form the ground line 230. Thus, core cell 202 has a parasitic resistor 240, core cell 204 has a parasitic resistor 242 and core cell 206 has a parasitic resistor 244.

Also shown in FIG. 2 is a portion 248 of the sensing circuit 112 of FIG. 1. The portion 248 of the sensing circuit includes a sense amplifier 250, a reference core cell 252 and a control circuit 254. The sense amplifier 250 has a first input configured to detect the read current in a bit line BLn. A particular bit line BLn is coupled to the sense amplifier 250 by the Y decoder of the memory. The sense amplifier 250 has a second input configured to detect a reference current in the reference core cell 252. The reference core cell 252 is substantially identical to the core cells 202, 204, 206 so that the reference current in the reference core cell 252 generally tracks variations in the read current of a selected core cell. The reference current forms a threshold against which the sense amplifier 250 compares the read current. If the read current exceeds the reference current, the sense amplifier 250 determines a first data state is stored in the selected core cell. If the read current does not exceed the reference current, the sense amplifier 250 determines a second data state is stored in the selected core cell.

The reference core cell 252 is coupled to a reference word line 260, labeled REFWL in FIG. 2. The reference core cell 252 includes a transistor 264 which conducts the reference current. The source of the reference transistor 252 is coupled to a reference ground node 262.

The ground line 230 establishes a variable parasitic potential between the ground potential Vss and the ground node Vss. The potential is parasitic because it is due to the parasitic resistance introduced in Vss between the source of each core cell transistor and Vss. The potential is variable because it depends on the current-resistance (IR) drop due to the read current in the ground line 230, which is variable. The read current in the example above varies from a negligible amount to 1.28 mA.

The variable parasitic potential on the ground line 230 introduces a source potential Vsn at each core cell. Thus, the ground node 220 of core cell 202 is at a source potential VS0. The ground node 222 of core cell 204 is at a source potential of VS1. The ground node 224 of core cell 206 is at a source potential VS63. Each source potential will vary with the state of the data stored in the core cells 202, 204, 206, with the state of data stored in neighboring core cells and with the position of the core cell in the core cell array. Variable IR drops on the ground line 230 cause the sources of the core cell transistors to be at a voltage greater than Vss.

When a transistor's source and bulk region are at different potentials, a body effect is introduced in the transistor. This increases the threshold voltage of the transistor and reduces the drain current Ids, or the read current in the case of the core cell transistor. As a result of the source bias, the read currents of the core cells vary depending on the state of stored data and position of the core cell in the array.

To accommodate this variation in the read currents of the core cells, the portion 248 of the sensing circuit further includes a circuit element 256 coupled between the reference ground node 262 and the ground potential Vss and configured to establish a variable reference potential to match the variable parasitic potential between the ground potential Vss and the ground node of a selected core cell.

The circuit element 256 applies a proportionate source bias to the read reference core cell to match parasitic bias in the selected core cell.

Any suitable circuit element may be used to perform the described function. In the illustrated embodiment, the circuit element 256 comprises a variable resistance controlled by the control circuit. The control circuit 254 tracks the variation in the read current due to (1) number of core cells selected for sensing; (2) stored data states of the core cells selected for sensing, (3) position in the core cell array of the core cells selected for sensing. Other factors may be detected and tracked as well. The control circuit 254 is coupled to the circuit element 254 to control the circuit element 256 in establishing the reference potential. Other suitable components that may be used alone or in conjunction with other components to perform the function of the circuit element 256 are transistors, diodes, capacitors and other passive and active components, along with various logic circuits.

As can be seen from the foregoing, the present invention provides an improved method and apparatus for sensing large numbers of bits in a page mode memory rapidly and reliably. The source bias introduced in each core cell is tracked by a reference source bias generator and a matching source bias is applied to the source of a read reference core cell. In this manner, the sense margin of the sensing circuit which senses the data state of the selected core cell is not reduced but remains centered about the reference current.

While one embodiment of the invention has been shown and described, variations are possible. For example, while the invention has been described in relation to a page mode memory integrated circuit, the inventive concepts and details may be applied to other types of integrated circuits as well. It is therefore intended in the appended claims to cover all such modifications falling within the true spirit and scope of the claims.

What is claimed is:

1. A memory comprising:
    an array of core cells, each core cell including a ground node;
    a ground line coupling the ground node of each core cell to a ground potential, the ground line establishing a variable parasitic potential between a ground potential and the ground node of each core cell;
    a reference core cell including a reference ground node; and
    a circuit element coupled between the reference ground node and the ground potential and configured to establish a variable reference potential to match the variable parasitic potential.

2. The memory of claim 1 wherein the ground line comprises a resistive portion of each core cell electrically coupled with resistive portions of adjacent core cells.

3. The memory of claim 1 further comprising:
    a sensing circuit coupled to the array of core cells and the reference core cell and configured to compare a core cell current in a core cell and a reference current in the reference core cell.

4. The memory of claim 3 wherein the circuit element adjusts the reference current to match variation in the core cell current due to the variable parasitic potential.

5. The memory of claim 1 wherein the circuit element is configured to vary the variable reference potential in response to a number of core cells selected for sensing.

6. The memory of claim 5 wherein the circuit element establishes the variable reference potential in response to stored data states of the core cells selected for sensing.

7. The memory of claim 6 further comprising:

a sensing circuit configured to sense the stored data states of the core cells selected for sensing.

8. The memory of claim 7 wherein the circuit element establishes the variable reference potential in response to position in the core cell array of the core cells selected for sensing.

9. The memory of claim 7 further comprising:

a control circuit coupled to the circuit element to control the circuit element in establishing the variable reference potential.

10. A method of sensing states of a plurality of core cells in a memory integrated circuit, the method comprising the steps of:

selecting a word line of a plurality of word lines;

sensing a bit line current in a selected core cell;

sensing a reference current in a reference core cell; and applying a bias potential to the reference core cell to match parasitic bias in the selected core cell.

11. The method of claim 10 further comprising the step of:

determining the parasitic bias at the selected core cell.

12. The method of claim 11 wherein the step of determining the parasitic bias comprises the step of:

determining the parasitic bias in response to a number of core cells selected.

13. The method of claim 12 wherein the step of determining the parasitic bias comprises the step of:

determining the parasitic bias in response to stored data states of selected core cells.

14. The method of claim 13 wherein the step of determining the parasitic bias comprises the step of:

determining the parasitic bias in response to position of the selected core cell in a core cell array of the memory.

15. A page mode memory in which a plurality of multi-bit words are sensed substantially and presented for reading one word at a time, the page mode memory comprising:

a core cell array including a plurality of core cells, each core cell when selected conducting one of a first current and a second current depending on stored data state of the core cell, each core cell including a parasitic element introducing a variable parasitic potential between the core cell and ground potential;

a sensing circuit configured to sense stored data states of a plurality of core cells;

a reference core cell configured to conduct a reference current for comparison by the sensing circuit with core cell current from selected core cells; and a circuit element coupled with the reference core cell and configured to introduce a variable reference potential in response to the variable parasitic potential.

16. The page mode memory of claim 15 wherein the circuit element varies the variable reference potential to match variation of the variable parasitic potential.

* * * * *